United States Patent
Dardona et al.

(10) Patent No.: US 10,903,415 B2
(45) Date of Patent: Jan. 26, 2021

(54) LARGE STRUCTURE MONITORING WITH A SUBSTRATE-FREE FLEXIBLE SENSOR SYSTEM

(71) Applicant: United Technologies Corporation, Farmington, CT (US)

(72) Inventors: Sameh Dardona, South Windsor, CT (US); Dustin D. Caldwell, Portland, CT (US); Callum Bailey, West Hartford, CT (US)

(73) Assignee: United Technologies Corporation, Farmington, CT (US)

( * ) Notice: Subject to any disclaimer, the term of this patent is extended or adjusted under 35 U.S.C. 154(b) by 178 days.

(21) Appl. No.: 16/266,837

(22) Filed: Feb. 4, 2019

(65) Prior Publication Data

US 2020/0253043 A1    Aug. 6, 2020

(51) Int. Cl.
*H01L 41/113*    (2006.01)
*H05K 1/02*    (2006.01)
(Continued)

(52) U.S. Cl.
CPC ....... *H01L 41/1132* (2013.01); *G01M 5/0083* (2013.01); *H01L 21/6835* (2013.01);
(Continued)

(58) Field of Classification Search
CPC .... G01M 5/0083; G01M 99/005; G01D 5/16; G01D 11/30; H01L 41/1132; H01L 2221/6835; H01L 2221/68359; H05K 1/0277; H05K 1/16; H05K 2201/10151; H05K 1/0283; H05K 1/118
See application file for complete search history.

(56) References Cited

U.S. PATENT DOCUMENTS

| | | | |
|---|---|---|---|
| 10,012,552 B2 | 7/2018 | Batzinger et al. | |
| 2007/0020445 A1* | 1/2007 | Liu | D03D 15/00 428/195.1 |

(Continued)

FOREIGN PATENT DOCUMENTS

WO    2016100218 A1    6/2016

OTHER PUBLICATIONS

Jason Trelewicz, PH.D., MesoPlasma Direct Write Fabrication of Conformal, Harsh Environment Sensors,Passive Wireless Sensor Tag Workshop, Jul. 27-28, 2011, Houston, TX, 20 pages.

*Primary Examiner* — Benjamin R Schmitt
(74) *Attorney, Agent, or Firm* — Kinney & Lange, P.A.

(57) ABSTRACT

A method of additively-manufacturing a flexible sensor system having a lattice topology includes a number of electrical interconnects, each having one or more electrically-conductive layers alternately sandwiched between two or more dielectric layers, and two or more sensors defining a sensor array, each sensor located at an intersection of and electrically connected to the interconnects on the lattice topology and electrically-connected to the interconnects. Each of the electrically-conductive layers includes a cured material base and silver, copper, aluminum, gold, platinum, ruthenium, carbon, and/or alloys thereof, and each of the dielectric layers includes a cured material base. The additively-manufactured flexible sensor system is configured to be installed on the surface of an asset for the monitoring of that asset.

20 Claims, 7 Drawing Sheets

(51) Int. Cl.

| | | |
|---|---|---|
| *H05K 1/16* | (2006.01) | |
| *H05K 3/00* | (2006.01) | |
| *H01L 41/317* | (2013.01) | |
| *H01L 41/047* | (2006.01) | |
| *H01L 27/20* | (2006.01) | |
| *H01L 41/053* | (2006.01) | |
| *H05K 3/12* | (2006.01) | |
| *H01L 21/683* | (2006.01) | |
| *G01M 5/00* | (2006.01) | |
| *H01L 41/29* | (2013.01) | |

(52) U.S. Cl.
CPC .......... *H01L 27/20* (2013.01); *H01L 41/0475* (2013.01); *H01L 41/0533* (2013.01); *H01L 41/29* (2013.01); *H01L 41/317* (2013.01); *H05K 1/0277* (2013.01); *H05K 1/16* (2013.01); *H05K 3/007* (2013.01); *H05K 3/1283* (2013.01); *H01L 2221/6835* (2013.01); *H01L 2221/68345* (2013.01); *H01L 2221/68359* (2013.01); *H01L 2221/68381* (2013.01); *H05K 2201/10151* (2013.01); *H05K 2203/107* (2013.01); *H05K 2203/1131* (2013.01)

(56) References Cited

U.S. PATENT DOCUMENTS

| | | | |
|---|---|---|---|
| 2009/0182515 A1* | 7/2009 | Pado | G01M 5/0066 |
| | | | 702/36 |
| 2011/0118990 A1 | 5/2011 | Sidhu et al. | |
| 2011/0260741 A1* | 10/2011 | Weaver | G06F 3/0445 |
| | | | 324/686 |
| 2015/0380355 A1* | 12/2015 | Rogers | H01L 29/78603 |
| | | | 257/773 |
| 2016/0290880 A1 | 10/2016 | Lewis et al. | |
| 2017/0106585 A1* | 4/2017 | Nino | G01M 5/0083 |
| 2017/0213648 A1 | 7/2017 | Joyce et al. | |
| 2017/0325724 A1 | 11/2017 | Wang et al. | |
| 2018/0175158 A1 | 6/2018 | Rogers et al. | |

\* cited by examiner

LARGE STRUCTURE MONITORING WITH A SUBSTRATE-FREE FLEXIBLE SENSOR SYSTEM

STATEMENT OF GOVERNMENT INTEREST

This invention was made with Government support under Contract No.: FA8650-15-2-5401, awarded by the Department of the Air Force. The Government has certain rights in the invention.

BACKGROUND

Asset monitoring is a critical safety and cost saving factor for a wide variety of aerospace, commercial, and infrastructure assets, with examples including aircraft components, bridges, and automotive vehicles. The monitoring of parameters on an asset can be helpful in monitoring the lifecycle of that asset, including the detection of asset failure, or the detection of parameters that can lead to failure. Typically, a sensor that monitors a particular parameter at a particular point on an asset is mounted on or embedded in the surface of the asset. Additionally, electrical interconnects and associated circuitry are also generally required for asset monitoring. Individual sensors that are mounted on or near the surface of an asset can be helpful in the monitoring of that asset. However, it can be preferable to have a greater number of sensors across an asset's surface to allow for a greater density of monitored parameters. As the surface area density of monitoring points increases, so does the associated size and/or weight of the electrical interconnects and associated circuitry for those sensors. In some applications, a substrate containing sensors and interconnect circuitry can be applied to the monitored surface of an asset. Generally, the accompanying increase in size and/or weight of the asset monitoring system can have an adverse effect on the structural properties of the monitored surface, and/or the performance of the asset.

A need exists for a flexible, substrate-free system that is capable of being installed on and conforming to a curved surface of a large asset, while minimally adding size and weight to the asset.

SUMMARY

A method of additively manufacturing a substrate-free flexible sensor on a sacrificial substrate by performing the steps of depositing a first dielectric layer of curable material defining a lattice topology, depositing an electrically-conductive layer of curable electrically-conductive material over the first dielectric layer thereby defining a pattern of interconnects and provide electrical connections to a sensor array, depositing one or more sensors on the lattice topology, each at an intersection of and electrically connected to the interconnects, depositing a second dielectric layer over the electrically-conductive layer, and then releasing the sensor system from the sacrificial substrate.

An additively-manufactured flexible sensor system having a lattice topology includes a number of electrical interconnects, each having one or more electrically-conductive layers alternately sandwiched between two or more dielectric layers, and two or more sensors defining a sensor array, each sensor located at an intersection of and electrically connected to the interconnects on the lattice topology and electrically-connected to the interconnects. Each of the electrically-conductive layers includes a cured material base and silver, copper, aluminum, gold, platinum, ruthenium, carbon, and/or alloys thereof, and each of the dielectric layers includes a cured material base. The additively-manufactured flexible sensor system is configured to be installed on or in the surface of an asset for the monitoring of that asset.

DETAILED DESCRIPTION

Figure 1A:
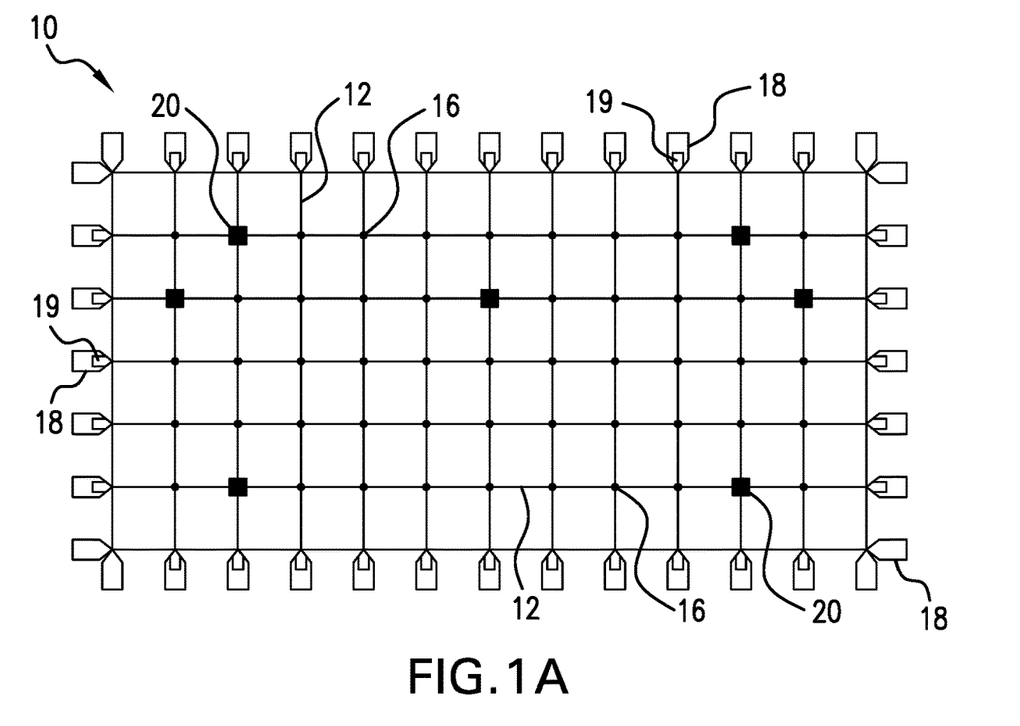
FIG. 1A is a top view of an embodiment of a substrate-free sensor system.

FIG. 1A is a top view of an embodiment of a substrate-free sensor system. Shown in FIG. 1A are sensor system 10, interconnects 12, routing junctions 16, handling tabs 18, contact pads 19, and sensor nodes 20. In the illustrated embodiment, sensor system 10 includes a network of overlapping interconnects 12 in a substantially rectangular array which can be described as a net-like structure. As depicted in FIG. 1A, interconnects 12 are either vertically-oriented or horizontally-oriented, each of the vertically-oriented interconnects 12 being substantially parallel to each other, and each of the horizontally-oriented interconnects 12 being substantially parallel to each other. The lattice structure of sensor system 10 depicted in FIG. 1A can be described as having a rectangular structure (i.e., net-like). The vertically-oriented interconnects 12 overlap the horizontally-oriented interconnects 12 at approximately right angles. Interconnects 12 are flexible, electrically-conductive strands. As will be described later in FIGS. 6-8, each interconnect 12 can include an electrically-conductive trace that is sandwiched between dielectric material (not shown in FIG. 1A). In some embodiments, two or more electrically-conductive strands can be included in one or more interconnects 12. In some of these embodiments, the two or more electrically-conductive strands can be parallel to each other, with an electrically-insulating region separating them. In other of these embodiments, the two or more electrically-conductive strands can be stacked one upon the other, with an electrically-insulating dielectric layer separating them. In yet other of these embodiments, some of the multiple electrically-conductive strands can be parallel to each other, and others of the multiple electrically-conductive strands can be stacked upon each other, as described above.

Referring again to FIG. 1A, interconnects 12 can be 80 microns wide (i.e., 80 µm) and 80 microns thick. In some embodiments, interconnects 12 can be less than 80 microns wide and/or 80 microns thick. In other embodiments, interconnects 12 can be more than 80 microns wide and/or 80 microns thick. In a particular embodiment, interconnects 12 can be more than 200 microns wide and/or 200 microns thick. In some embodiments, the width of a particular interconnect 12 can be either greater than or less than the thickness. In some of these embodiments, the width of a particular interconnect 12 can be much greater than the thickness. In designing sensor system 10, several factors can be considered in the selection of the size (i.e., width and thickness) of interconnects 12. Non-limiting examples of these factors can include the current-carrying capacity of interconnect 12, the desired electrical resistance of interconnect 12, the materials used in interconnect 12, and the allowable size and/or weight of sensor system 10. It is to be appreciated that as used in the present disclosure, terms such as "vertical" and "horizontal" are arbitrary, as used in describing the various embodiments that are illustrated in the figures. All orientations are within the scope of the present disclosure without regard to spatial orientation.

In the illustrated embodiment, the electrically-conductive part of interconnect 12 (i.e., electrically-conductive strand) can be made from conductive inks containing silver, copper, aluminum, gold, platinum, ruthenium, carbon, and/or alloys of these metals. In other embodiments, the electrically-conductive part of interconnect 12 can be made from these and/or other metals, alloys, partial conductors, and/or composites. The dielectric part of interconnect 12 can be made from photoset and thermoset polymer dielectric inks, extruded thermoplastics, and the like. In the illustrated embodiment, interconnects 12 are flexible (i.e., bendable, conformable), thereby enabling sensor system to conform to a curved surface when so positioned. In some embodiments, interconnects 12 cannot stretch appreciably, meaning that sensor system 10 can conform to a surface having a radius primarily in one direction. In other embodiments, interconnects 12 can have an appreciable stretchability, thereby allowing sensor system to conform to an irregular surface profile. As will be described later in FIG. 1B, other embodiments can be used to achieve stretchability of interconnects 20.

Each point where perpendicular interconnects 12 overlap can be routing junction 16 or sensor node 20. Routing junctions 16 provide a mechanical connection between intersecting interconnects 12, helping provide structural support for sensor system 10. Any particular routing junction 16 can be either electrically conductive (i.e., providing an electrical connection between overlapping interconnects 12) or insulating (i.e., not providing an electrical connection between overlapping interconnects 12). Interconnects 12, routing junctions 16, and sensor nodes 20 together define a lattice topology of sensor system 10. Sensor node 20 can also be referred to as a sensor, and can be a sensing element that is configured to provide an electrical signal in response to one or more sensed parameters. Non-limiting examples of sensed parameters include pressure, temperature, stress, strain, acceleration, vibration, acoustical energy (i.e., sound), and photonic energy (i.e., light). Any particular sensor node 20 can be configured to respond to one or more parameters. In a particular embodiment, any particular sensor node 20 can be configured to respond to a particular range of parameters. In some embodiments, any particular sensor node 20 can provide an electrical signal in response to a sensed parameter without requiring an electrical supply. Sensor nodes 20 can be any type of sensor, now known or later developed. Non-limiting examples of sensors that can be used for a particular sensor node 20 can include thermocouples, resistance temperature detectors (RTDs), piezoelectric wafers, photocells, electrical resistance cells, electrical resistance bridges (e.g., Wheatstone bridge), electrical capacitance cells, and micro-electro-mechanical systems (MEMS) cells. It is to be noted that a particular sensor node 20 can be attached to four interconnects 12. Accordingly, in some embodiments, a particular sensor node 20 can receive and/or produce voltages and/or signals that can employ up to four electrical connections per conductive layer. Additional electrically-conductive traces can be used to increase the maximum possible connections per node, as described above. In other embodiments, two or more interconnects 12 that enter a particular sensor node 20 can be electrically connected to each other.

A particular sensor node 20 can be configured to produce one or more electrical responses. Non-limiting examples of electrical responses can include resistance, capacitance, inductance, voltage, and non-linear responses (i.e., as produced by a semiconductor device). In other embodiments, any particular sensor node 20 can receive an electrical supply and provide an electrical output in response to a sensed parameter. In some embodiments, the electrical output from any particular sensor node 20 can be an analog signal (e.g., resistance value, voltage level). In other embodiments, the electrical output from any particular sensor node 20 can be a digital signal (i.e., one or more digital pulses). In yet other embodiments, the electrical output from any particular sensor node 20 can be a combination of analog and digital signals. In an exemplary embodiment, a piezoelectric wafer can be used to provide an indication of the structural health of a system. In another exemplary embodiment, material strain can be measured with a resistor in a Wheatstone bridge. In the illustrated embodiment, some or all of routing junctions 16 can be used for electrically connecting sensor system 10 to external circuitry. The configuration of electrically-connectable routing junctions 16 can be referred to as an attachment profile.

In the illustrated embodiment, handling tabs 18 contain contact pads 19, both of which surround the perimeter of sensor system 10. Handling tabs 18 can be used to hold, position, and/or maneuver sensor system 10 while installing sensor system 10 on an asset to be monitored. Contact pads 19 are electrically conductive, and provide electrical connectivity from sensor system 10 to external circuitry (not shown). In the illustrated embodiment, handling tabs 18 are made of a dielectric polymer, and contact pads 19 are an electrically-conductive layer on handling tabs 18, being made of the same conductive material as interconnects 12. In other embodiments, contact pads 19 can be made of a material that is different from that of interconnects 12. In these other embodiments, contact pads can be made of an electrically conductive material that is selected to provide mechanical adhesion and electrical connectivity from contact pads 19 to the external circuitry. In the illustrated embodiment, handling tabs 18 are approximately 4 mm wide and contact pads 19 are approximately 2 mm wide. In some embodiments, handling tabs 18 can either be more than or less than 4 mm wide. In some embodiments, contact pads 19 can either be more than or less than 2 mm wide. In the illustrated embodiment, the width of contact pad 19 is less than the width of handling tab 18. This can be beneficial in an embodiment where the monitored asset (not shown in FIG. 1A) has an electrically-conductive surface. In other embodiments, the width of contact pad 19 can be similar to the width of handling tab 18. This can be beneficial, for example, in an embodiment where handling tabs 18 and contact pads 19 are trimmed to a smaller size following the fabrication of sensor system 10. In yet other embodiments, one or more contact pads 19 can have a width that is greater than the width of the associated handling tab 18.

Referring again to FIG. 1A, a monitored asset can be any component having a surface where it can be desirable to position sensor system 10 having one or more sensor nodes 20. The examples in the present disclosure are generally directed at aircraft components, such as nacelles, wings, control surfaces, fuselages, nosecones, and the like. All monitored assets are within the scope of the present disclosure, with non-limiting examples including fixed and rotary wing aircraft, vehicles for use on land and sea, under the sea, or in space, pressure vessels, piping, and other industrial components, commercial and residential buildings and other structures, towers, bridge spans, and roadways.

Figure 1B:
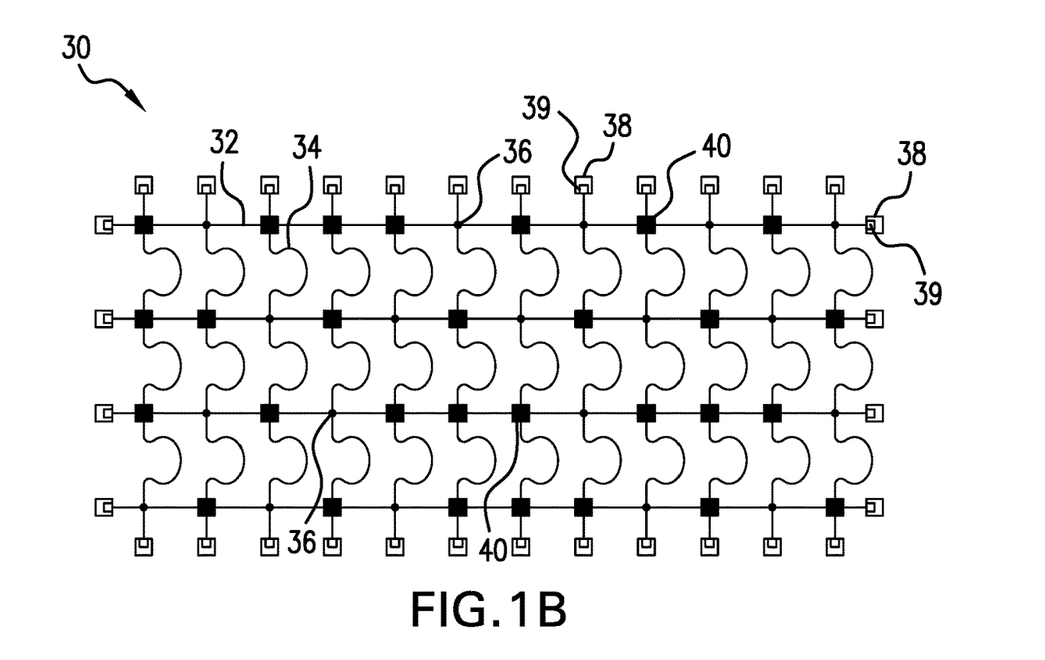
FIG. 1B is a top view of a second embodiment of the substrate-free sensor system.

FIG. 1B is a top view of a second embodiment of the substrate-free sensor system. Shown in FIG. 1B are sensor system 30, interconnects 32, stretchable interconnects 34, routing junctions 36, handling tabs 38, contact pads 39, and sensor nodes 40. Sensor system 30 includes interconnects 32 that are aligned in one direction (i.e., horizontally, as depicted in FIG. 1A), and stretchable interconnects 34 aligned in another direction (i.e., vertically, as depicted in FIG. 1A). The description of interconnects 32, routing junctions 36, handling tabs 38, contact pads 39, and sensor nodes 40 is substantially similar to that provided above in regard to FIG. 1A. As can be seen in the illustrated embodiment, stretchable interconnects 34 include additional material that can allow sensor system 30 to stretch (i.e., vertically, as depicted in FIG. 1A). Accordingly, various portions of one or more stretchable interconnects 34 can elongate to allow the stretching of sensor system 30 to occur. Accordingly, sensor system 30 can conform to a curved surface having an irregular surface profile and/or having a radius of curvature in more than one direction.

Figure 2:
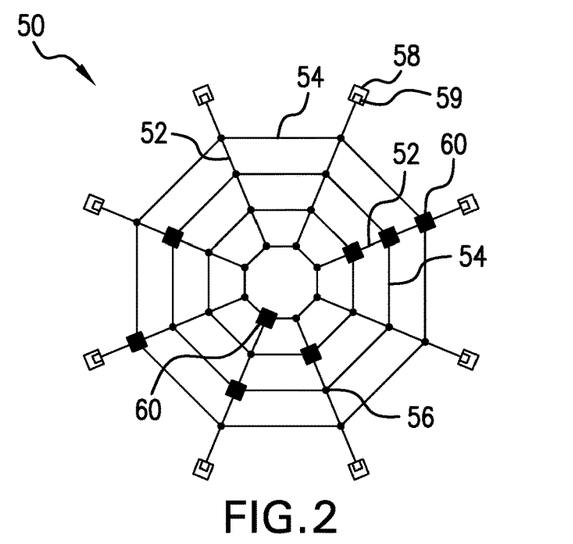
FIG. 2 is a top view of a third embodiment of the substrate-free sensor system.

FIG. 2 is a top view of a third embodiment of the substrate-free sensor system. Shown in FIG. 2 are sensor system 50, radial interconnects 52, azimuthal interconnects 54, routing junctions 56, handling tabs 58, contact pads 59, and sensor nodes 60. Sensor system 50 includes an arrangement of radial interconnects 52 projecting outward from a central region, and azimuthal interconnects 54 concentrically encircling the central region. The arrangement (i.e., lattice topology) of sensor system 50 can be described as having a "spider web" structure in appearance. The description of radial interconnects 52 and azimuthal interconnects 54 is similar to that provided above in regard to FIG. 1A. In the illustrated embodiment, sensor system 50 can be used on an asset having a circular or elliptical shape. In some embodiments, radial interconnects 52 and/or azimuthal interconnects 54 can be stretchable, thereby allowing sensor system 50 to conform to a surface. It is to be appreciated that radial interconnects 52 and/or azimuthal interconnects 54 can be configured to be stretchable, for example, in a manner similar to that described above regarding stretchable interconnects 34 shown in FIG. 1B. Accordingly, sensor system 50 can be configured to conform to a conical or semi-hemispherical surface of a monitored asset. A non-limiting example of a conical surface is the nose cone of an aircraft. The description of routing junctions 56, handling tabs 58, contact pads 59, and sensor nodes 60 is substantially similar to that provided above in regard to FIGS. 1A-1B.

Figure 3:
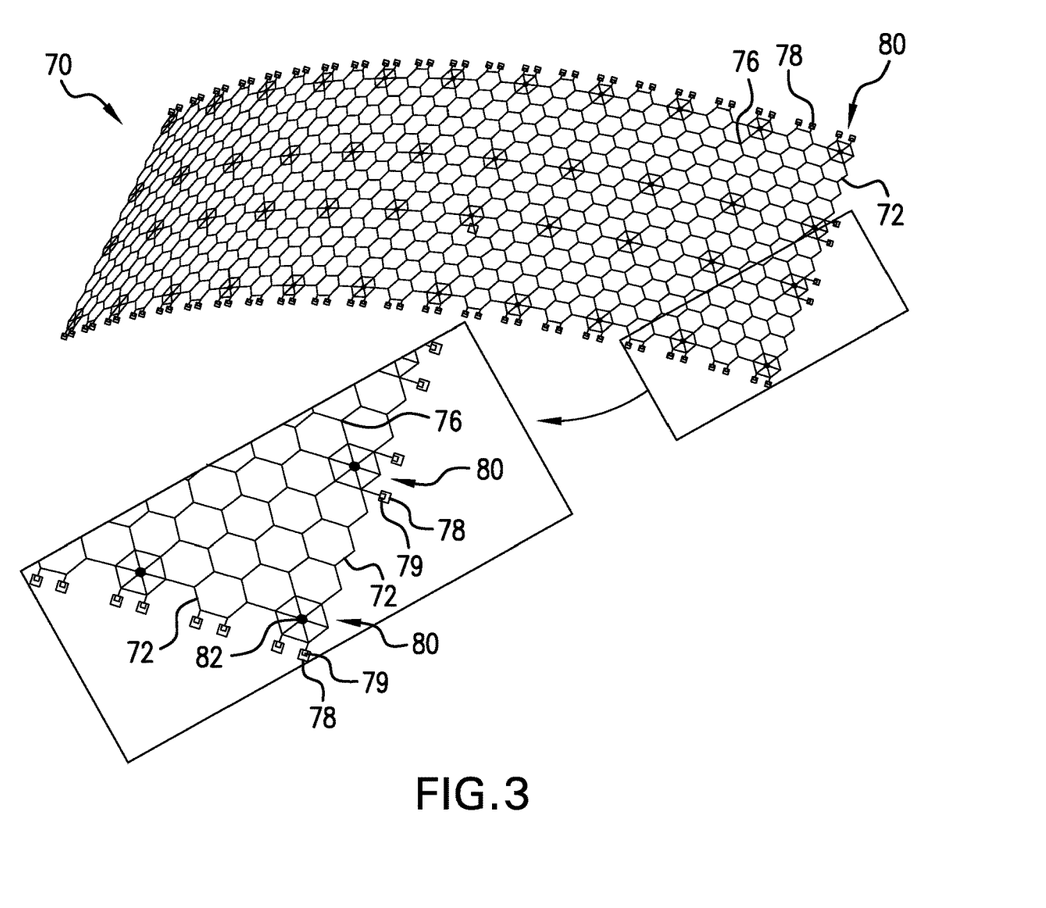
FIG. 3 is a top view of a fourth embodiment of the substrate-free sensor system.

FIG. 3 is a top view of a fourth embodiment of the substrate-free sensor system. Shown in FIG. 3 are sensor system 70, interconnects 72, routing junctions 76, handling tabs 78, contact pads 79, sensor cells 80, and sensor nodes 82. In the illustrated embodiment, sensor system 70 includes interconnects 72 arranged in a hexagonal pattern. The arrangement (i.e., lattice topology) of sensor system 70 can be described as having a "honeycomb" structure in appearance. Moreover, each sensor node 82 is positioned within a grouping of interconnects 72 that define sensor cell 80, with several interconnects 72 attaching to a particular sensor node 82. The description of interconnects 72, routing junctions 76, handling tabs 78, contact pads 79, and sensor nodes 82 is substantially similar to that provided above in regard to FIG. 1A. Sensor node 82 can also be referred to as a sensor. The honeycomb lattice topology of the illustrated embodiment can have high out-of-plane compression properties and/or high out-of-plane shear properties, which can help minimize the risk of failure during handling and deployment (i.e., during installation on a monitored asset).

In the illustrated embodiment, six interconnects 72 are attached to a particular sensor cell 80. In other embodiments, fewer than six interconnects 72 can be attached to a particular sensor cell 80. An advantage of sensor system 70 can be the ability to attach multiple interconnects 72 to a particular sensor cell 80, which can provide connectivity redundancy, in turn, allowing sensor system 70 to be more resilient against failure. It is to be noted that a particular sensor node 82 can be attached to six interconnects 72 per conductive layer. Accordingly, in some embodiments, a particular sensor node 82 can receive and/or produce voltages and/or signals that can employ up to six electrical connections. In other embodiments, interconnects 72 can have additional electrically-conductive traces to increase the maximum possible connections per node, as described above in regard to FIG. 1A. Accordingly, in these other embodiments, a particular sensor node 82 can receive and/or produce voltages and/or signals that can employ more than six electrical connections.

Figure 4:
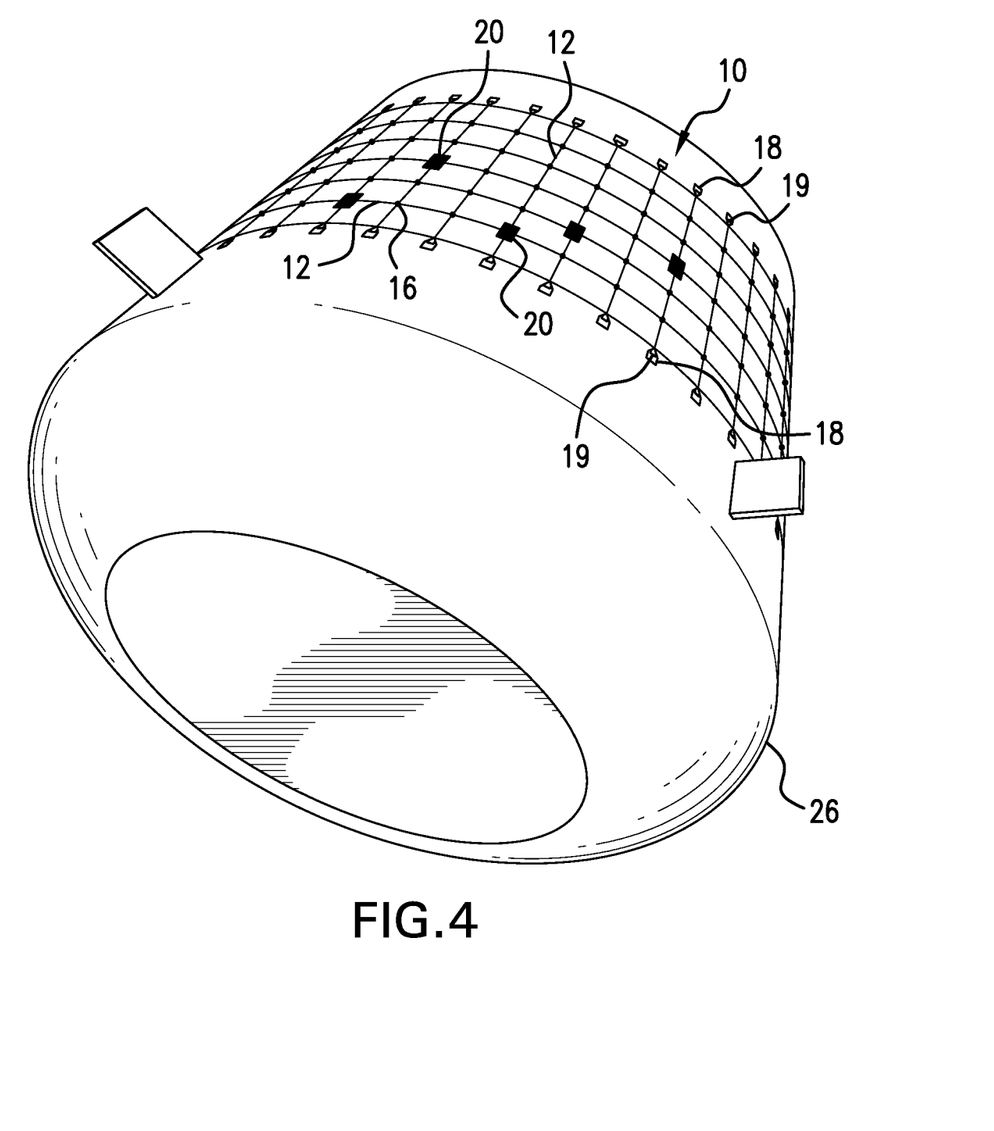
FIG. 4 is a perspective view showing the substrate-free sensor system deployed on a monitored component.

FIG. 4 is a perspective view showing the substrate-free sensor system deployed on a monitored component. Shown in FIG. 4 are sensor system 10, interconnects 12, routing junctions 16, handling tabs 18, contact pads 19, sensor nodes 20, and monitored asset 26. Sensor system 10 is installed on monitored asset 26. The description of sensor system 10, interconnects 12, routing junctions 16, handling tabs 18, contact pads 19, and sensor nodes 20 is substantially as provided above in regard to FIG. 1A. In the illustrated embodiment, monitored asset 26 is a nacelle on an aircraft. FIG. 4 depicts sensor system 10 following the placement (i.e., deployment) on monitored asset 26. In the illustrated embodiment, sensor system 10 conforms to a curved surface of monitored asset 26. As described above in regard to FIG. 1A, contact pads 19 are used to provide electrical connectivity between sensor system 10 and external circuitry (not shown).

Figure 5:
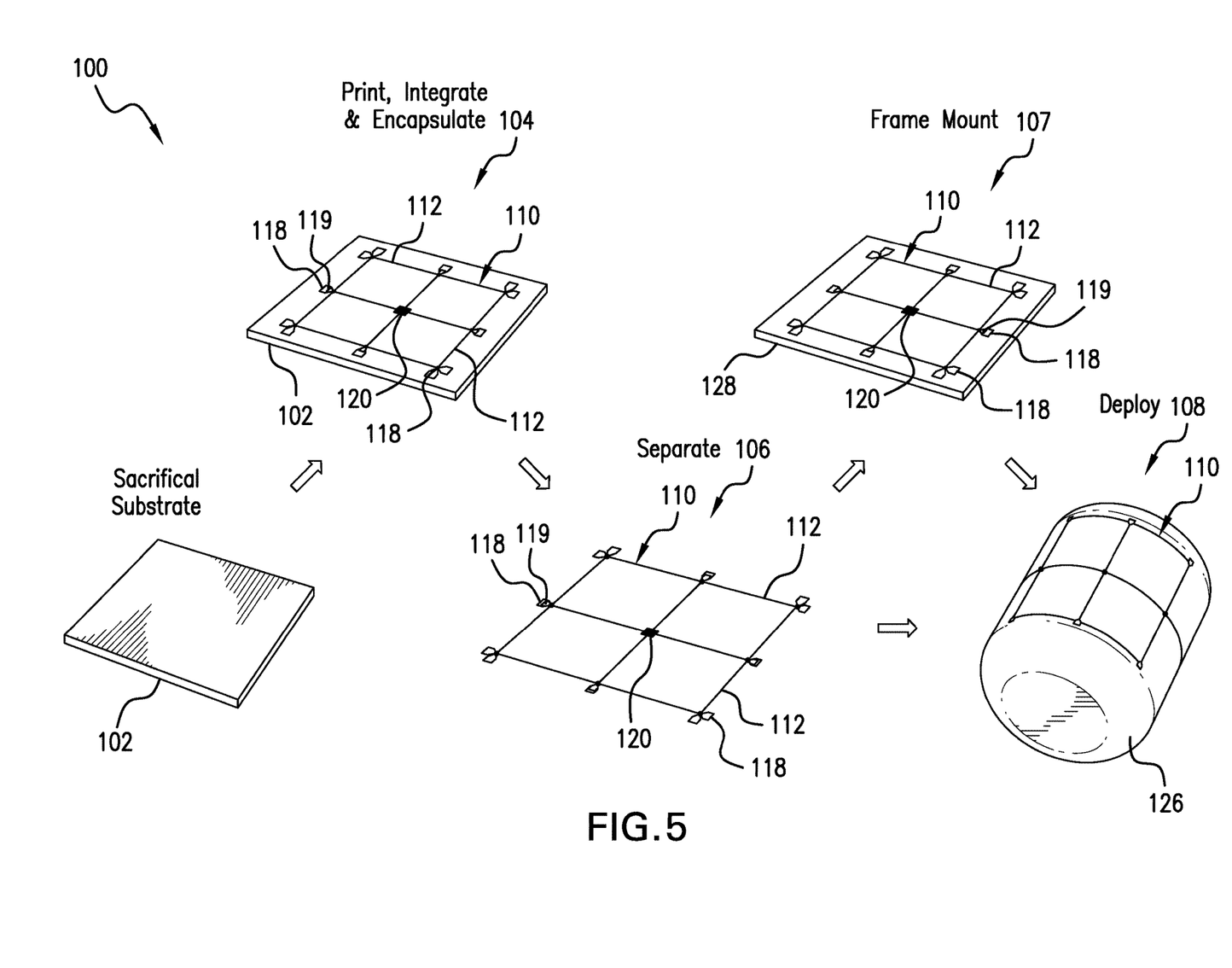
FIG. 5 is a process flow diagram showing steps in fabricating the substrate-free sensor system.

FIG. 5 is a process flow diagram showing steps in fabricating the substrate-free sensor system. Shown in FIG. 5 are sensor system process 100, sacrificial substrate 102, fabricate step 104, separate step 106, frame-mounting step 107, deploy step 108, sensor system 110, interconnects 112, routing junctions 116, handling tabs 118, contact pads 119, sensor nodes 120, monitored asset 126, and mounting frame 128. In the illustrated embodiment, sensor system 110 can be printed (i.e., additively-manufactured) on sacrificial substrate 102. As used in this disclosure, "printing" is an additive-manufacturing process that can refer to any of a number of processes that can deposit material for fabricating a component or components. Sacrificial substrate 102 can be a plate, sheet, or continuous roll of material, and can be thick or thin, and/or rigid or flexible. In a particular embodiment, sacrificial substrate 102 can be a thin-film material on a roll, with sensor system process 100 using a roll-to-roll (R2R) manufacturing process. In another particular embodiment, sacrificial substrate 102 can be a sheet of rigid or semi-rigid material, with sensor system process 100 using a large screen printing manufacturing process. Sacrificial substrate 102 can be chemically soluble or insoluble, with chemical solubility being one of the possible means of later removing sacrificial substrate 102 from sensor system 110.

During fabricate step 104 (i.e., print, integrate, and encapsulate), the lattice topology of interconnects 112, routing junctions 116, and sensor nodes 120, as well as handling tabs 118 and contact pads 119, can be delivered by one of several possible additive manufacturing and/or printing methods, with non-limiting examples including screen printing, R2R, gravure printing, ink jet printing aerosol jet (AJ) deposition, extrusion direct-write microdispensing, micro-cold spray deposition, thermal-spray deposition, and mesoplasma spray (i.e., miniaturized thermal spray). In the illustrated embodiment, some sensor nodes 120 can be integrated circuits (ICs) that are deposited onto sensor system 110. The deposition of integrated circuits onto sensor system 110 will be described in more detail below, in regard to FIG. 6. It is to be appreciated that fabricate step 104 can include a number of internal steps, or processes. The description of interconnects 112, routing junctions 116, handling tabs 118, contact pads 119, and sensor nodes 120 is substantially as provided above in regard to FIG. 1A. Internal circuit connections are made between interconnects 112 and sensor nodes 120 during fabricate step 104. The conductive portions of interconnects 112 and the sensing components of sensor nodes 120 are encapsulated within dielectric (i.e., electrically-insulating) materials during fabricate step 104.

In the illustrated embodiment, sensor system 110 is printed (i.e., additively manufactured) on sacrificial substrate 102 in four layers, whereby the first layer defines the lattice topology (i.e., structure), the second layer establishes interconnects 112, sensing nodes 120, and other circuitry components, the third layer provides encapsulation, and the fourth layer defines the attachment profile (i.e., points of electrical connectivity to external circuitry). In the illustrated embodiment, curing of one or more layers produced during one or more of the afore-described internal steps can be accomplished by using light energy and/or heat. Accordingly, the various printing inks (i.e., fluid materials) that form the various layers of sensor system 110 can be made using a curable resin. In some embodiments, the curable resin can be a photopolymer (i.e., light-activated resin) that changes properties when exposed to light. A photopolymer that is optimized to respond to ultraviolet (UV) light is known as a UV-curable resin. The photopolymer can be comprised of monomers and/or oligomers, and photoinitiators, thereby allowing the printing inks to be soft and flowable in an uncured condition, then becoming sufficiently viscous or solid as a result of the cross-linking of the monomers and/or oligomers during the light-activating process. The process by which printing ink (e.g., photopolymer resin) becomes more viscous or solidifies is also known as curing. A photopolymer cures by the action of photoinitiators that absorb photon energy during exposure to light of a particular wavelength or range of wavelengths. As the printing ink (i.e., photopolymer resin) cures, it becomes sufficiently viscous or solid, while also bonding to any solid material that it is in contact with. In some embodiments, the printing ink can be selected to be responsive to ultraviolet light having a wavelength of about 100-425 nanometers (nm). In some of these embodiments, the printing ink can be selected to be responsive to ultraviolet light having wavelengths of about 365-405 nm. Ultraviolet light sources of about 365 nm and 405 nm wavelengths may be commercially available and readily adaptable to the process of the present disclosure. In some embodiments, the printing ink (i.e., photopolymer resin) can cure as a result to a broader range of wavelengths. In some of these embodiments, visible light can initiate the curing process (e.g., the shorter wavelengths of visible light near the violet end of the visible light spectrum). Accordingly, in some embodiments, special precautions may need to be taken to prevent the premature curing (i.e., viscofication or solidification) of the printing ink (i.e., photopolymer).

In other embodiments, the curable resin can be responsive to an elevated temperature for initiating the curing process. Higher temperatures may accelerate the curing rate of the printing ink, with a temperature of about 120° C. (248° F.) resulting in a noteworthy rate of curing. Temperatures ranging from about 55° C. (131° F.) to about 140° C. (284° F.) can be used to effectuate a noteworthy rate of curing the printing ink during fabricate step 104. In yet other embodiments, the curable resin can be a thermoplastic, thermoset resin, or thermally-cured ink that uses a thermal solvent for evaporation/sintering of the ink. In yet other embodiments, non-resin materials can be used for one or more of the various layers of sensor system 110. As used in this disclosure, "curable material" described any material that can undergo viscofication, hardening, and/or solidification during a fabrication process. Accordingly, both resins (i.e., photoresins, thermal-resins) and non-resins can be curable materials. Non-limiting examples of curable non-resins include thermal plastics, inks, metals, and/or other materials that can be deposited (i.e., printed) as powders, molten materials, liquids, and the like by one or more additive-manufacturing processes (e.g., cold spray, thermal spray, thermal solvent evaporation, sintering). It is to be appreciated that the various layers of interconnects 112 can be made of different curable materials, for example, as described above. Accordingly, in some embodiments the curable materials that are used for an electrically-conductive layer and a dielectric layer can be referred to as "first" and "second" curable materials, respectively. In some of these embodiments, the first and second curable materials can be similar to each other, or substantially the same.

Figure 7:
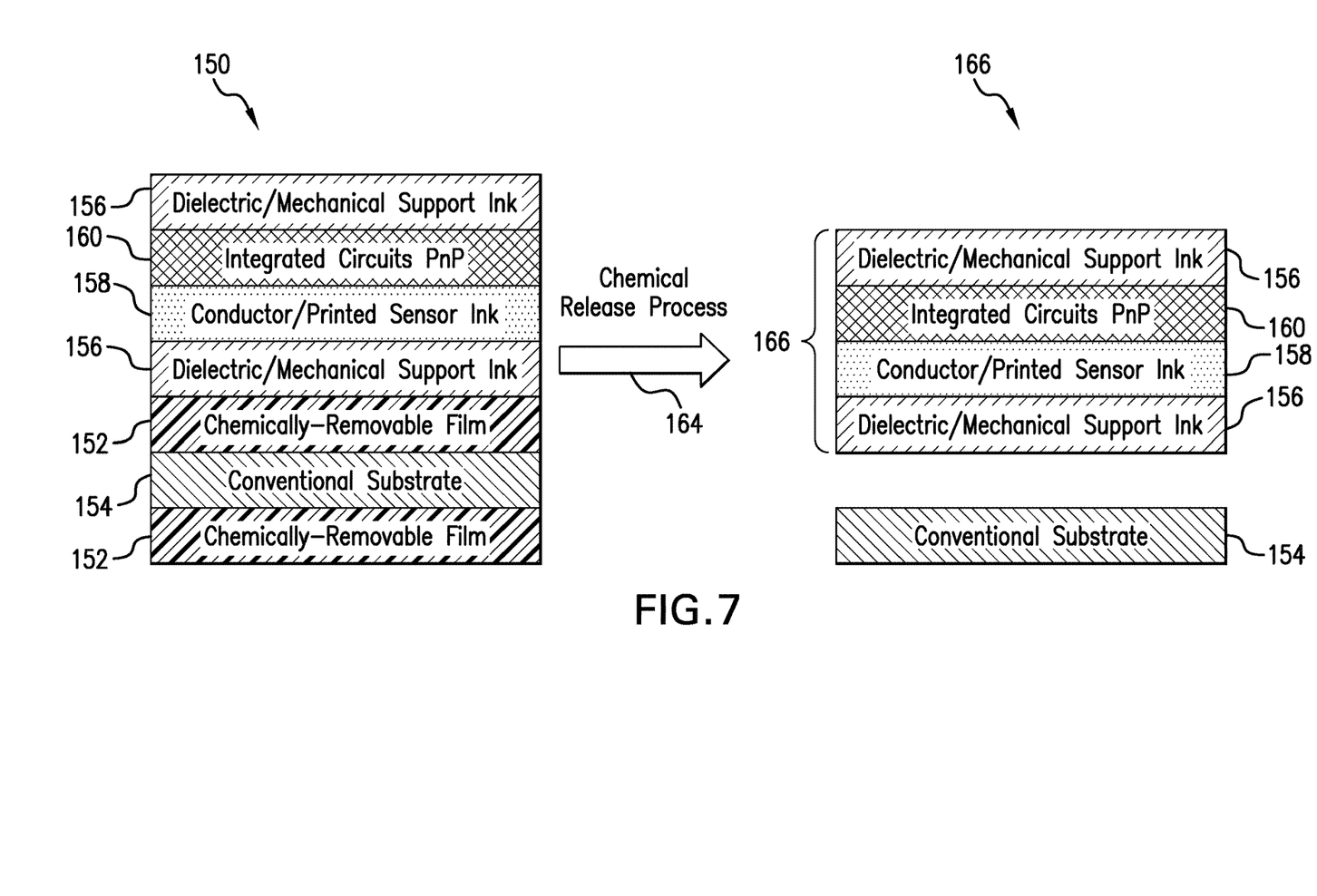
FIG. 7 is a schematic cross-sectional side view of second embodiment of the substrate-free sensor system before and after the chemical release process.
Figure 8:
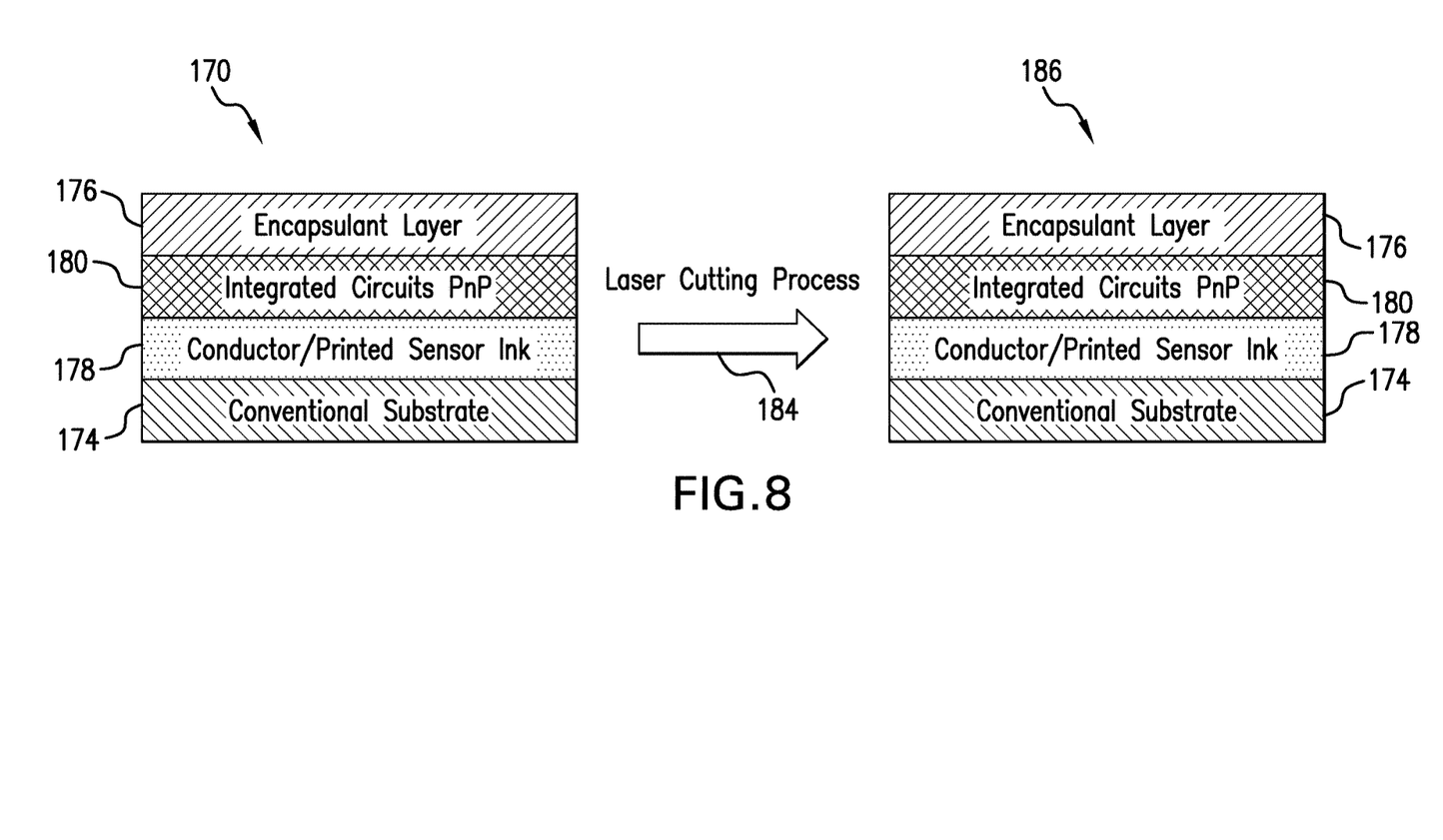
FIG. 8 is a schematic cross-sectional side view of the substrate-free sensor system before and after the laser cutting process.

Referring again to FIG. 5, sensor system 110 is removed from sacrificial substrate 102 during separate step 106 using one or more of any number of material removal processes. In an embodiment, sacrificial substrate 102 can be chemically-dissolvable, allowing removal of sacrificial substrate 102 from sensor system 110 by the use of a dissolvent. Non-limiting examples of chemical dissolvents include water, alcohol, limonene, and alkali solutions. In another embodiment, sacrificial substrate 102 can include a surface coating (not shown) that is chemically-dissolvable. Non-limiting examples of material for sacrificial substrate 102 can be polyimide (e.g., KAPTON®), polyethylene terephthalate, and polycarbonate having a thin film soluble surface coating. Non-limiting examples of soluble surface coatings include polyvinyl alcohol (e.g., water soluble), soluble acrylates (e.g., alkali soluble), and polystyrene (e.g., limonene soluble). In yet another embodiment, sacrificial substrate 102 can be mechanically removed from sacrificial substrate. For example, a non-limiting example of a mechanical removal process is using a laser to cut away sacrificial substrate 102, for example, by the use of a pulsed femtosecond laser. Various embodiments of sensor system 110 will be shown below in FIGS. 6-8, showing various configurations and techniques for separate step 106.

It is to be appreciated that handling tabs 118 can be used to handle sensor system 110 during separate step 106. After removing sensor system 110 in separate step 106, sensor system 110 can be stored for an indeterminate period of time prior to being installed on an asset to be monitored. In the illustrated embodiment, sensor system 110 is placed on mounting frame 128 in frame-mounting step 107 prior to installation on an asset. In some embodiments, sensor system 110 can be stored using other storage method steps, with non-limiting examples including lying flat, hanging, and rolling around a roller or drum. In other embodiments, frame-mounting step 107 can be omitted, and sensor system 110 can be installed immediately on an asset. Accordingly, in some embodiments, frame-mounting step 107 can be optional.

Referring again to FIG. 5, sensor system 110 is installed (i.e., deployed) on monitored asset 126 in deploy step 108. Monitored asset 126 is substantially similar to that described above in regard to FIG. 4, and can be any component on which sensor system 120 can be installed for monitoring. As noted above, sensor system 110 can be handled by handling tabs 118 throughout separate step 106 and frame-mounting step 107. The lattice network of sensor system 110 is positioned on the desired surface of monitored asset 126, and is adhered by one or more processes. In one embodiment, sensor system 110 can be bonded to the surface of monitored asset 126 by use of a separate bonding agent (not shown). In another embodiment, sensor system 110 can be bonded to the surface of monitored asset 126 by activating an adhesive layer on sensor system 110 and/or on monitored asset 126. In yet another embodiment, sensor system 110 can be embedded in or under the surface of monitored asset 126. In any of these embodiments, an overcoat (not shown) can be applied over sensor system 110 during or after deploy step 108. After sensor system 110 is installed (i.e., deployed) on monitored asset 126, sensor system 110 can be connected to external circuitry (not shown) by means of contact pads 119.

Figure 6:
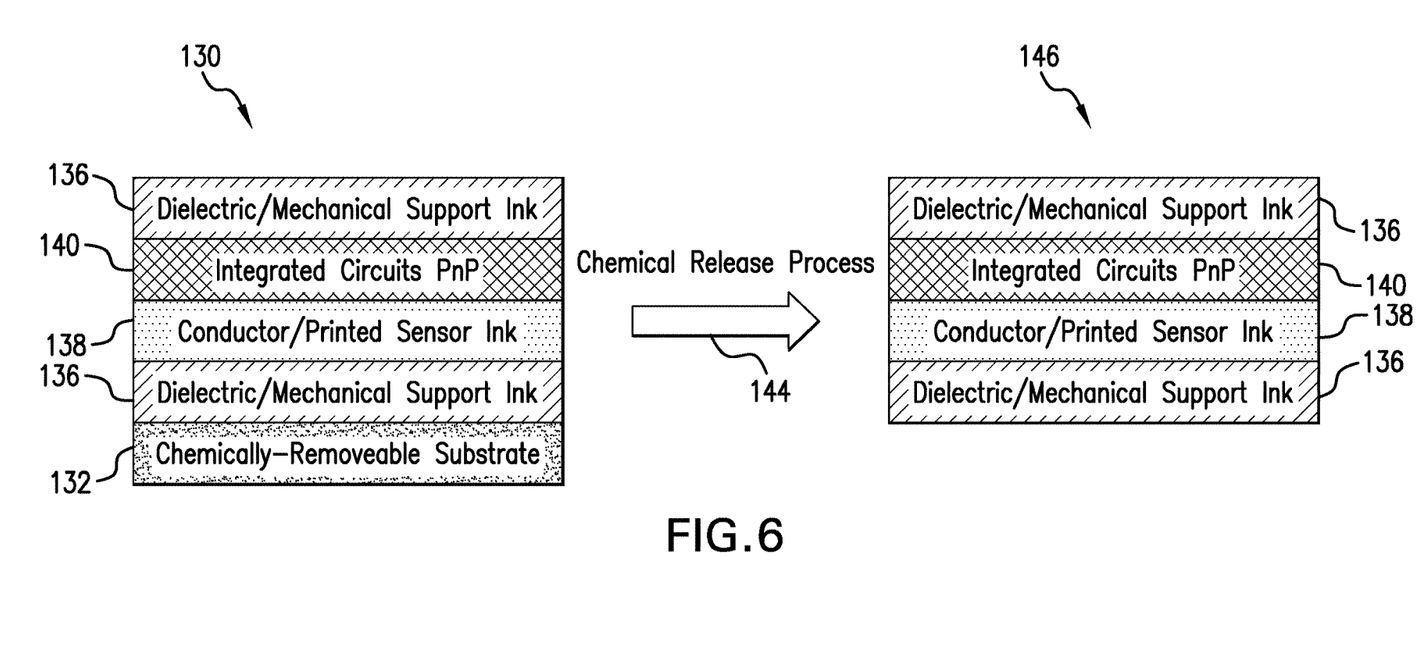
FIG. 6 is a schematic cross-sectional side view of the substrate-free sensor system before and after the chemical release process.

FIG. 6 is a schematic cross-sectional side view of the substrate-free sensor system before and after the chemical release process shown in FIG. 5. Shown in FIG. 6 are fabricated sensor structure 130, chemically-removable substrate 132, dielectric/mechanical support ink 136, conductor/printed sensor ink 138, integrated circuits 140, chemical release process 144, and sensor structure 146. Fabricated sensor structure 130 depicts a representative sensor (i.e., sensor node 20 as described above in regard to FIG. 1A). Chemically-removable substrate 132 is substantially similar to sacrificial substrate 102 described above in regard to FIG. 5. During the fabrication of fabricated sensor structure 130 (e.g., fabricate step 104 shown above in FIG. 5), various layers (i.e., dielectric/mechanical support ink 136, conductor/printed sensor ink 138, integrated circuits 140) are deposited (e.g., printed, additively manufactured) using printing ink. It is to be appreciated that curing of the printing ink can occur following the printing of each of the various layers, with the curing (i.e., viscofication or solidification) of the printing ink (i.e., curable material) being either partial or complete. Those who are skilled in the art of additive manufacturing using curable materials (i.e., curable resins or non-resins) are familiar with the various methods that can be used to cure or to partially cure printed layers of a curable material.

Referring again to FIG. 6, a first layer of dielectric/mechanical support ink 136 is printed on to chemically-removable substrate 132. Dielectric/mechanical support ink 136 provides an electrical dielectric (i.e., insulating layer), while also providing mechanical support (i.e., structural integrity). Next, conductor/printed sensor ink 138 is printed over dielectric/mechanical support ink 136. Conductor/printed sensor ink 138 can be electrically conductive, being formed of a mixture of metallic elements and curable materials. Examples of metallic elements include those described above in regard to interconnects 12 shown in FIG. 1A. Conductor/printed sensor ink 138 can be connected to associated interconnects (not shown in FIG. 6). Next, integrated circuits 140 are deposited onto conductor/printed sensor ink 138 while establishing proper electrical conduction paths necessary for the sensor to operate. In the illustrated embodiment, integrated circuits 140 are conventional monolithic semiconductor circuit packages that are set onto conductor/printed sensor ink 138 using a pick-and-place (PnP) manufacturing process, thereby providing a flexible hybrid electronic network. Next, a second layer of dielectric/mechanical support ink 136 is printed over integrated circuits 140, thereby providing an electrical dielectric (i.e., insulating layer), while also providing mechanical support (i.e., structural integrity). In other embodiments, integrated circuits 140 can be additively-manufactured sensors that are manufactured in place by using any of several processes that can be used to additively-manufacture (i.e., print) a sensor. Accordingly, as used in this disclosure, integrated circuit 140 refers to any electronic device that can act as a sensor, transducer, and/or circuit. Moreover, as used in this disclosure, depositing integrated circuit 140 can be performed by a PnP manufacturing process and/or a printing (i.e., additive-manufacturing) process. In some embodiments, conductor/printed sensor ink 138 can be an electrically-conductive layer that is fabricated by a direct material deposition process using a metal or alloy, as described above in regard to FIG. 5. Accordingly, in these embodiments, it is not necessary for conductor/printed sensor ink 138 to contain curable materials in addition to electrically-conductive materials. In the illustrated embodiment, fabricated sensor structure 130 has a single layer of conductor/printed sensor ink 138. In other embodiments, two or more layers of conductor/printed sensor ink 138 can be used, each being sandwiched between alternating layers of dielectric/mechanical support ink 136, thereby providing two or more electrically-conductive strands in a particular interconnect as described above in regard to FIG. 1A.

Referring again to FIG. 6, chemical release process 144 is applied to fabricated sensor structure 130, thereby separating the sensor node (i.e., dielectric/mechanical support ink 136, conductor/printed sensor ink 138, and integrated circuits 140) from chemically-removable substrate 132. It is to be appreciated that the accompanying interconnects, routing junctions, handling tabs, and contact pads (not shown in FIG. 6) are fabricated concurrently with fabricated sensor structure 130. Accordingly, these accompanying components can be separated from chemically-removable substrate 132 concurrently during chemical release process 144. In the illustrated embodiment, chemical release process 144 can be substantially similar to one of the exemplary methods described above regarding separate step 106 in FIG. 5, thereby yielding sensor structure 146 (i.e., sensor node 20, as shown in FIG. 1A).

FIG. 7 is a schematic cross-sectional side view of second embodiment of the substrate-free sensor system before and after a chemical release process. Shown in FIG. 7 are fabricated sensor structure 150, chemically-removable film 152, conventional substrate 154, dielectric/mechanical support ink 156, conductor/printed sensor ink 158, integrated circuits 160, chemical release process 164, and sensor structure 166. Fabricated sensor structure 150 includes conventional substrate 154 sandwiched between two layers of chemically-removable film 152 at the base. Dielectric/mechanical support ink 156, conductor/printed sensor ink 158, integrated circuits 160, and sensor structure 166 are substantially similar to those shown above in regard to FIG. 6. After additively-manufacturing (i.e., depositing, printing) fabricated sensor structure 150, chemical release process 164 is applied to fabricated sensor structure 150, thereby separating the sensor node (i.e., dielectric/mechanical support ink 156, conductor/printed sensor ink 158, and integrated circuits 160) from conventional substrate 154 by the chemically dissolution of both layers of chemically-removable film 152. Accordingly, sensor structure 166 remains lying on conventional substrate 154, but is not attached to conventional substrate 154.

Chemical release process 164 yields sensor structure 166 (i.e., sensor node 20, as shown in FIG. 1A), and can be substantially similar to one of the exemplary methods described above regarding separate step 106 in FIG. 5. Moreover, it is to be appreciated that the accompanying interconnects, routing junctions, handling tabs, and contact pads (not shown in FIG. 7) are fabricated concurrently with fabricated sensor structure 150, and are separated from conventional substrate 154 concurrently with sensor structure 166. In the illustrated embodiment, fabricated sensor structure 150 has a single layer of conductor/printed sensor ink 158. In other embodiments, two or more layers of conductor/printed sensor ink 158 can be used, each being sandwiched between alternating layers of dielectric/mechanical support ink 156, thereby providing two or more electrically-conductive strands in a particular interconnect as described above in regard to FIG. 1A.

FIG. 8 is a schematic cross-sectional side view of the substrate-free sensor system before and after a laser cutting process. Shown in FIG. 8 are fabricated sensor structure 170, conventional substrate 174, encapsulant layer 176, conductor/printed sensor ink 178, integrated circuits 180, laser-cutting process 184, and sensor structure 186. Fabricated sensor structure 170, conventional substrate 174, conductor/printed sensor ink 178, integrated circuits 180, and sensor structure 186 are all substantially similar to those described above in regard to FIG. 7. In the illustrated embodiment, encapsulant layer 176 is a dielectric overcoat that can also provide exterior surface protection to sensor structure 186. In some embodiments, conventional substrate 174 provides sufficient mechanical support for sensor structure 186, and a mechanical support ink is not required (i.e., dielectric/mechanical support ink 156 in FIG. 7). In other embodiments, encapsulant layer 176 can be a dielectric/mechanical support ink. In the illustrated embodiment, fabricated sensor structure 170 has a single layer of conductor/printed sensor ink 178. In other embodiments, two or more layers of conductor/printed sensor ink 178 can be used, each being sandwiched between alternating layers of encapsulant later 176, thereby providing two or more electrically-conductive strands in a particular interconnect as described above in regard to FIG. 1A.

Referring again to FIG. 8, laser cutting process 184 uses a laser beam for cutting (i.e., ablation) of sensor structure 186 (i.e., encapsulant layer 176, conductor/printed sensor ink 178, integrated circuits 180) from conventional substrate 174. In a particular embodiment, laser cutting process 184 can use a pulsed femtosecond laser that provides an ultra-short pulse of high-energy light. A pulsed femtosecond laser can be useful in performing precision micro-machining of the various materials associated with sensor structure 186, while providing minimal impact of the surrounding materials (i.e., a heat-affected zone) because of the ultrashort laser pulse duration (i.e., close to or less than one femtosecond, $1 \times 10^{-15}$ sec.) In other embodiments, other lasers can be used for laser cutting process 184. Those who are skilled in the laser art are familiar with the various types of lasers that can be used for precision-machining of microelectronic components and associated materials.

Discussion of Possible Embodiments

The following are non-exclusive descriptions of possible embodiments of the present invention.

A method of making a substrate-free flexible sensor system, the method comprising: additively manufacturing, on a sacrificial substrate, a sensor system by performing the steps of: (a) depositing a first dielectric layer defining a lattice topology, the first dielectric layer comprising a curable material; (b) depositing an electrically-conductive layer over the first dielectric layer, wherein: the electrically-conductive layer comprises a curable electrically-conductive material; the electrically-conductive layer is configured to provide electrical connections to a sensor array; and the electrically-conductive layer defines a pattern of interconnects; (c) depositing one or more sensors on the lattice topology, each of the one or more sensors being disposed at a point defined by an intersection of interconnects and electrically connected to the electrical connections; and (d) depositing a second dielectric layer over the electrically-conductive layer; and performing a release process, thereby releasing the sensor system from the sacrificial substrate.

The method of the preceding paragraph can optionally include, additionally and/or alternatively, any one or more of the following features, configurations and/or additional components:

A further embodiment of the foregoing method, wherein depositing the first dielectric layer comprises the steps of: printing a layer of a curable first material; and curing the curable first material using light and/or heat; and depositing the electrically-conductive layer comprises the steps of: printing a layer of a curable second material; and curing the curable second material using light and/or heat.

A further embodiment of the foregoing method, wherein depositing the first dielectric layer comprises aerosol jet (AJ) deposition, extrusion-based direct-write microdispensing, roll-to-roll (R2R) printing, gravure printing, screen printing, and/or thermal spray; and depositing the electrically-conductive layer comprises aerosol jet (AJ) deposition, extrusion-based direct-write microdispensing, roll-to-roll (R2R) printing, gravure printing, screen printing, cold spray, and/or thermal spray.

A further embodiment of the foregoing method, wherein the curable material comprises one or more of: thermoplastic, wherein the curing is by cooling; and curable ink, wherein the curing comprises evaporation and/or sintering of a thermal solvent.

A further embodiment of the foregoing method, wherein the sensor is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

A further embodiment of the foregoing method, wherein the sensor is a piezoelectric cell configured to provide an electrical signal that is representative of a health of a structure.

A further embodiment of the foregoing method, wherein the electrically-conductive material comprises silver, copper, aluminum, gold, platinum, ruthenium, carbon, and/or alloys thereof.

A further embodiment of the foregoing method, wherein the lattice topology is a grid comprising: a plurality of horizontally-oriented interconnects; and a plurality of vertically-oriented interconnects; wherein: each of the one or more sensors comprises a sensor node; and an intersection of a horizontally-oriented interconnect and a vertically-oriented interconnect defines a junction selected from the group consisting of a routing junction and a sensor node.

A further embodiment of the foregoing method, wherein the lattice topology comprises a honeycomb pattern; and each of the one or more sensors defines a sensor cell.

A further embodiment of the foregoing method, wherein the lattice topology comprises radial interconnects and azimuthal interconnects.

A further embodiment of the foregoing method, wherein the lattice structure is stretchable in at least one dimension; and the substrate-free flexible sensor system is conformable to a surface having an irregular surface profile.

A further embodiment of the foregoing method, wherein the sacrificial substrate is chemically-dissolvable by a dissolvent; and the dissolvent comprises water, alcohol, limonene, and/or an alkali solution.

A further embodiment of the foregoing method, wherein the sacrificial substrate further comprises a chemically-dissolvable surface coating comprising polyvinyl alcohol, soluble acrylate, and/or polystyrene.

A further embodiment of the foregoing method, wherein the release process comprises precision micro-machining using a laser.

A further embodiment of the foregoing method, wherein the laser is a femtosecond laser.

A further embodiment of the foregoing method, wherein the lattice topology defines a perimeter; and the method further comprises: additively-manufacturing a plurality of handling tabs disposed around the perimeter; and additively manufacturing one or more contact pads, each of the one or more contact pads on an associated one or more of the plurality of handling tabs; wherein the one or more contact pads are configured to provide an electrical connection to the sensor system.

A further embodiment of the foregoing method, wherein additively manufacturing the sensor system further comprises the steps of: (e) depositing a second electrically-conductive layer over the second dielectric layer, wherein: the second electrically-conductive layer comprises the curable electrically-conductive material; the second electrically-conductive layer is configured to provide electrical connections to the sensor array; and the second electrically-conductive layer further defines the pattern of interconnects; and (f) depositing a third dielectric layer over the second electrically-conductive layer.

An additively-manufactured flexible sensor system having a lattice topology, comprising: a plurality of interconnects comprising one or more electrically-conductive layers alternately sandwiched between two or more dielectric layers, wherein: each of the one or more the electrically-conductive layers includes: silver, copper, aluminum, gold, platinum, ruthenium, carbon, and/or alloys thereof; and a cured first material base; and each of the two or more dielectric layers includes a cured second material base; and the interconnects are configured to provide electrical connections to a sensor array; and two or more sensors defining the sensor array, each of the two or more sensors being disposed on the lattice topology and electrically-connected to the interconnects; wherein the additively-manufactured flexible sensor system is configured to be disposed on the surface of an asset.

The additively-manufactured flexible sensor system of the preceding paragraph can optionally include, additionally and/or alternatively, any one or more of the following features, configurations and/or additional components:

A further embodiment of the foregoing additively-manufactured flexible sensor system, wherein: the interconnects are flexible, thereby allowing the lattice topology to conform to a curved surface; and at least some of the interconnects are stretchable, thereby allowing the lattice topology to conform to a surface having an irregular surface profile.

A further embodiment of the foregoing additively-manufactured flexible sensor system, wherein the lattice topology comprises a structure selected from the group consisting of: a rectangular structure comprising horizontally-oriented interconnects and vertically-oriented interconnects; a circular structure comprising radial interconnects and azimuthal interconnects; and a hexagonal pattern comprising a honeycomb pattern, further comprising a plurality of sensor cells, each sensor cell encompassing a sensor.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of making a substrate-free flexible sensor system, the method comprising:
   additively manufacturing, on a sacrificial substrate, a sensor system by performing the steps of:
   (a) depositing a first dielectric layer defining a lattice topology, the first dielectric layer comprising a curable material;
   (b) depositing an electrically-conductive layer over the first dielectric layer, wherein:
      the electrically-conductive layer comprises a curable electrically-conductive material;
      the electrically-conductive layer is configured to provide electrical connections to a sensor array; and
      the electrically-conductive layer defines a pattern of interconnects;
   (c) depositing one or more sensors on the lattice topology, each of the one or more sensors being disposed at a point defined by an intersection of interconnects and electrically connected to the electrical connections; and
   (d) depositing a second dielectric layer over the electrically-conductive layer; and
   performing a release process, thereby releasing the sensor system from the sacrificial substrate.

2. The method of claim 1, wherein:
   depositing the first dielectric layer comprises the steps of:
      printing a layer of a curable first material; and
      curing the curable first material using light and/or heat; and depositing the electrically-conductive layer comprises the steps of:
printing a layer of a curable second material; and
curing the curable second material using light and/or heat.

3. The method of claim 1, wherein:
depositing the first dielectric layer comprises aerosol jet (AJ) deposition, extrusion-based direct-write microdispensing, roll-to-roll (R2R) printing, gravure printing, screen printing, and/or thermal spray; and
depositing the electrically-conductive layer comprises aerosol jet (AJ) deposition, extrusion-based direct-write microdispensing, roll-to-roll (R2R) printing, gravure printing, screen printing, cold spray, and/or thermal spray.

4. The method of claim 1, wherein the curable material comprises one or more of:
thermoplastic, wherein the curing is by cooling; and
curable ink, wherein the curing comprises evaporation and/or sintering of a thermal solvent.

5. The method of claim 1, wherein the sensor is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

6. The method of claim 1, wherein the sensor is a piezoelectric cell configured to provide an electrical signal that is representative of a health of a structure.

7. The method of claim 1, wherein the electrically-conductive material comprises silver, copper, aluminum, gold, platinum, ruthenium, carbon, and/or alloys thereof.

8. The method of claim 1, wherein the lattice topology is a grid comprising:
a plurality of horizontally-oriented interconnects; and
a plurality of vertically-oriented interconnects;
wherein:
each of the one or more sensors comprises a sensor node; and
an intersection of a horizontally-oriented interconnect and a vertically-oriented interconnect defines a junction selected from the group consisting of a routing junction and a sensor node.

9. The method of claim 1, wherein:
the lattice topology comprises a honeycomb pattern; and
each of the one or more sensors defines a sensor cell.

10. The method of claim 1, wherein the lattice topology comprises radial interconnects and azimuthal interconnects.

11. The method of claim 1, wherein:
the lattice structure is stretchable in at least one dimension; and
the substrate-free flexible sensor system is conformable to a surface having an irregular surface profile.

12. The method of claim 1, wherein:
the sacrificial substrate is chemically-dissolvable by a dissolvent; and
the dissolvent comprises water, alcohol, limonene, and/or an alkali solution.

13. The method of claim 1, wherein the sacrificial substrate further comprises a chemically-dissolvable surface coating comprising polyvinyl alcohol, soluble acrylate, and/or polystyrene.

14. The method of claim 1, wherein the release process comprises precision micro-machining using a laser.

15. The method of claim 14, wherein the laser is a femtosecond laser.

16. The method of claim 1, wherein:
the lattice topology defines a perimeter; and
the method further comprises:
additively-manufacturing a plurality of handling tabs disposed around the perimeter; and
additively manufacturing one or more contact pads, each of the one or more contact pads on an associated one or more of the plurality of handling tabs;
wherein the one or more contact pads are configured to provide an electrical connection to the sensor system.

17. The method of claim 1, wherein additively manufacturing the sensor system further comprises the steps of:
(e) depositing a second electrically-conductive layer over the second dielectric layer, wherein:
the second electrically-conductive layer comprises the curable electrically-conductive material;
the second electrically-conductive layer is configured to provide electrical connections to the sensor array; and
the second electrically-conductive layer further defines the pattern of interconnects; and
(f) depositing a third dielectric layer over the second electrically-conductive layer.

18. An additively-manufactured flexible sensor system having a lattice topology, comprising:
a plurality of interconnects comprising one or more electrically-conductive layers alternately sandwiched between two or more dielectric layers, wherein:
each of the one or more the electrically-conductive layers includes:
silver, copper, aluminum, gold, platinum, ruthenium, carbon, and/or alloys thereof; and
a cured first material base; and
each of the two or more dielectric layers includes a cured second material base; and
the interconnects are configured to provide electrical connections to a sensor array; and
two or more sensors defining the sensor array, each of the two or more sensors being disposed on the lattice topology and electrically-connected to the interconnects;
wherein the additively-manufactured flexible sensor system is configured to be disposed on the surface of an asset.

19. The additively-manufactured flexible sensor system of claim 18, wherein:
the interconnects are flexible, thereby allowing the lattice topology to conform to a curved surface; and
at least some of the interconnects are stretchable, thereby allowing the lattice topology to conform to a surface having an irregular surface profile.

20. The additively-manufactured flexible sensor system of claim 18, wherein the lattice topology comprises a structure selected from the group consisting of:
a rectangular structure comprising horizontally-oriented interconnects and vertically-oriented interconnects;
a circular structure comprising radial interconnects and azimuthal interconnects; and
a hexagonal pattern comprising a honeycomb pattern, further comprising a plurality of sensor cells, each sensor cell encompassing a sensor.

* * * * *